United States Patent
Sasaya et al.

(10) Patent No.: US 11,387,794 B2
(45) Date of Patent: Jul. 12, 2022

(54) POWER AMPLIFIER CIRCUIT INCLUDING MULTIPLE INVERTERS CONNECTED IN PARALLEL

(71) Applicants: DENSO CORPORATION, Kariya (JP); National University Corporation Toyohashi University of Technology, Toyohashi (JP)

(72) Inventors: Takanari Sasaya, Kariya (JP); Tetsuo Hirano, Kariya (JP); Takashi Ohira, Toyohashi (JP); Naoki Sakai, Toyohashi (JP); Takaaki Masaki, Toyohashi (JP)

(73) Assignees: DENSO CORPORATION, Kariya (JP); National University Corporation Toyohashi University of Technology, Toyohashi (JP)

( * ) Notice: Subject to any disclaimer, the term of this patent is extended or adjusted under 35 U.S.C. 154(b) by 223 days.

(21) Appl. No.: 16/729,544

(22) Filed: Dec. 30, 2019

(65) Prior Publication Data
US 2020/0266776 A1    Aug. 20, 2020

(30) Foreign Application Priority Data
Feb. 19, 2019 (JP) .............................. JP2019-027700

(51) Int. Cl.
| | |
|---|---|
| *H02M 7/537* | (2006.01) |
| *H03F 3/217* | (2006.01) |
| *H03H 7/38* | (2006.01) |
| *H02M 7/493* | (2007.01) |
| *H03F 3/193* | (2006.01) |
| *H02M 7/48* | (2007.01) |

(52) U.S. Cl.
CPC .......... *H03F 3/2176* (2013.01); *H02M 7/493* (2013.01); *H02M 7/537* (2013.01); *H03F 3/193* (2013.01); *H03H 7/38* (2013.01); *H02M 7/4815* (2021.05); *H03F 2200/387* (2013.01); *H03F 2200/451* (2013.01)

(58) Field of Classification Search
CPC ....... H02H 7/38; H02M 7/4815; H03F 3/2176
See application file for complete search history.

(56) References Cited

U.S. PATENT DOCUMENTS

| | | | |
|---|---|---|---|
| 8,890,618 B2 * | 11/2014 | Pamarti | H03F 1/56 330/295 |
| 2013/0188408 A1 | 7/2013 | Yamamoto | |

(Continued)

FOREIGN PATENT DOCUMENTS

| | | |
|---|---|---|
| JP | 2011-135232 A | 7/2011 |
| JP | 2013-017115 A | 1/2013 |
| WO | 2013/183700 A1 | 12/2013 |

*Primary Examiner* — Peter M Novak
(74) *Attorney, Agent, or Firm* — Posz Law Group, PLC

(57) ABSTRACT

In each E-class inverter, an internal voltage detection circuit detects an internal voltage of a resonant type power supply circuit or a matching circuit and adjusts a phase of a driving signal of a MOSFET based on a detected voltage. It is thus possible to match a phase of a current voltage of a sine waveform of each inverter and combine power highly efficiently. Since power combining is performed highly efficiently without using a variable capacitor and variable inductor, it is possible to suppress upsizing of elements and achieve downsizing of a power amplifier circuit.

6 Claims, 9 Drawing Sheets

(56) References Cited

U.S. PATENT DOCUMENTS

2017/0170794 A1   6/2017  Mayo et al.
2017/0279312 A1   9/2017  Akuzawa et al.
2020/0059198 A1*  2/2020  Ahmadi .................. H03B 1/02

* cited by examiner

FIG. 9A

| X1 | X2 | X3 | PURE RESISTANCE → PURE RESISTANCE | $r_1 < r_2$ | INDUCTOR INCREASE |
|---|---|---|---|---|---|
| L | L | L | × | — | 2 |
| L | L | C | ○ | × | 1 |
| L | C | L | ○ | ○ | 1 |
| L | C | C | ○ | ○ | 0 |
| C | L | L | ○ | ○ | 2 |
| C | L | C | ○ | ○ | 1 |
| C | C | L | ○ | × | 1 |
| C | C | C | × | — | 0 |

FIG. 9B

| X1 | X2 | X3 | PURE RESISTANCE → PURE RESISTANCE | $r_1 < r_2$ | INDUCTOR INCREASE |
|---|---|---|---|---|---|
| L | L | L | × | — | 3 |
| L | L | C | ○ | ○ | 2 |
| L | C | L | ○ | ○ | 2 |
| L | C | C | ○ | × | 1 |
| C | L | L | ○ | × | 2 |
| C | L | C | ○ | ○ | 1 |
| C | C | L | ○ | ○ | 1 |
| C | C | C | × | — | 0 |

POWER AMPLIFIER CIRCUIT INCLUDING MULTIPLE INVERTERS CONNECTED IN PARALLEL

CROSS REFERENCE TO RELATED APPLICATION

The present application claims the benefit of priority from Japanese Patent Application No. 2019-27700 filed on Feb. 19, 2019. The entire disclosures of the above application are incorporated herein by reference.

FIELD

The present disclosure relates generally to a power amplifier circuit, with an exemplary embodiment directed to class E inverters, including at least two systems of resonant type power supplies which generate AC output power.

BACKGROUND

As a conventional power amplifier circuit, an RF (radio frequency) power amplifier configured to generate a large power by connecting multiple resonant type power supplies is known. The RF power amplifier is used in various applications such as induction heating, plasma processing, wireless power supply and the like. In these applications, the RF power amplifier is required to be compact in size and high in efficiency from the standpoint of easy assembling and power usage rate, and have high output power for attaining a higher processing ability and supply power.

SUMMARY

According to the present disclosure, a power amplifier circuit is provided for generating an AC output power supplied to a load from a DC power. The power amplifier circuit comprises multiple inverters. Each inverter includes a resonant type power supply circuit, which has a switching element and generates the AC output power from the DC power, and an impedance matching circuit provided at an output side of the resonant type power supply circuit. The multiple inverters are connected in parallel such that the resonant type power supply circuit of the each inverter is connected in parallel with each other through the impedance matching circuit of the each inverter.

BRIEF DESCRIPTION OF THE DRAWINGS

FIG. 9A is an illustration in a table form summarizing features of various combinations of reactance elements used in the T-type matching circuit;

FIG. 9B is an illustration in a table form summarizing features of various combinations of reactance elements used in the Π-type matching circuit;

DETAILED DESCRIPTION OF THE EMBODIMENT

Figure 1:
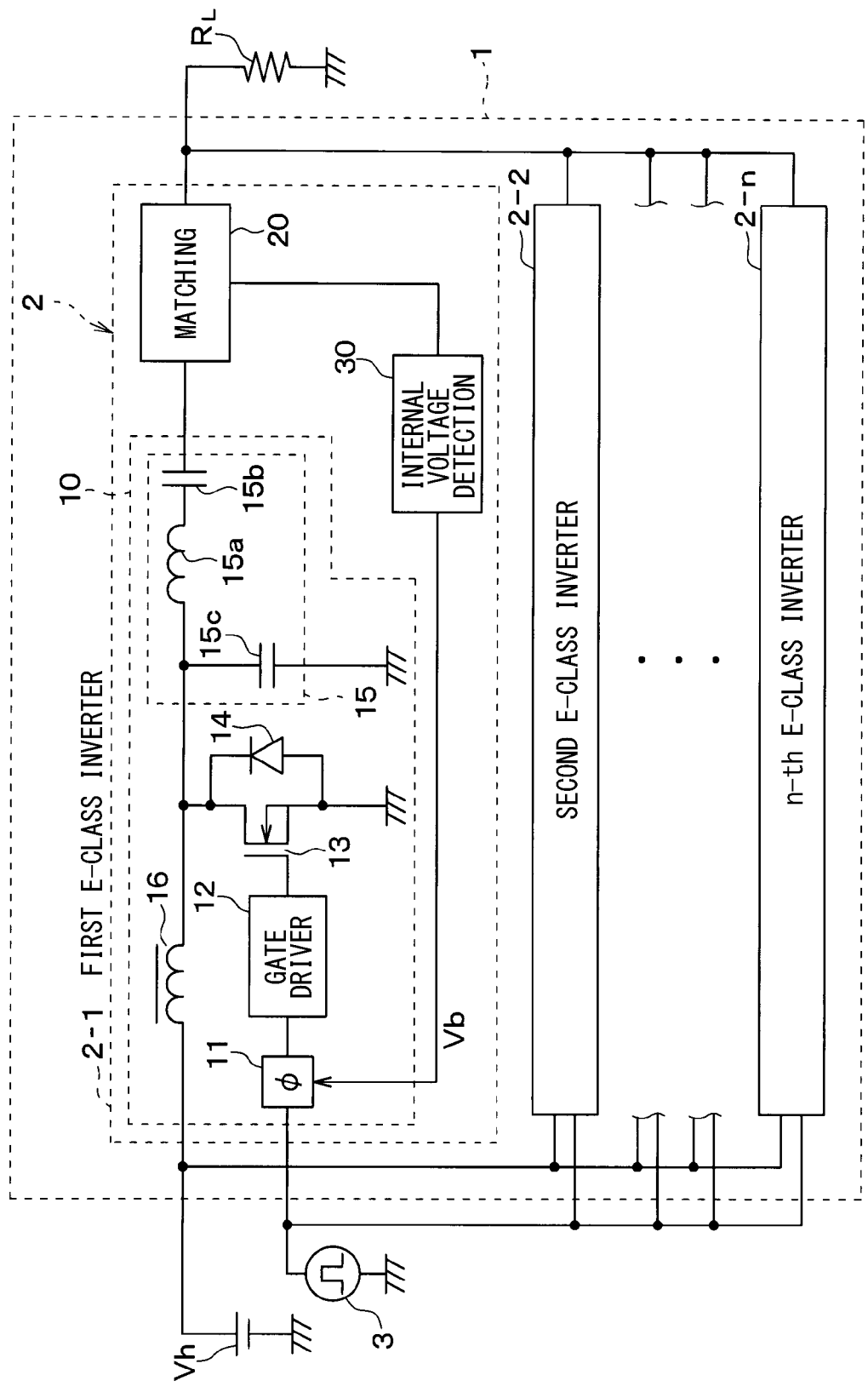
FIG. 1 is a diagram showing a circuit configuration of a power amplifier circuit according to a first embodiment.

For making an RF power amplifier to be compact in size and high in efficiency, an E-class amplifier using semiconductor switches is suitable. It is theoretically possible to increase the output power of the E-class amplifier by increasing a DC input voltage. However, the output power is limited by a withstanding voltage of the semiconductor switch because a voltage of as large as several times of the input voltage is applied to the semiconductor switch.

It is possible to increase the output power which exceeds the output limitation caused by the withstanding voltage of the semiconductor switch by combining the outputs of multiple E-class amplifiers through a power combining circuit provided separately. However, the power combining circuit provided separately becomes a cause of power loss.

It is also under research to increase the output power by directly combining the outputs of the E-class amplifiers without separately providing the power combining circuit. According to this method under research, it is necessary to operate the E-class amplifiers completely in phase, that is, without operation phase difference among the E-class amplifiers. Even in case that each E-class amplifier has the same configuration, the operation characteristic and gate signal delay vary among semiconductor switching elements in the each E-class amplifier. It is thus difficult to operate the E-class amplifiers in phase completely. Therefore, incomplete in-phase operation causes power loss of the semiconductor switching element in the E-class amplifier of a certain phase and disables increasing of the output.

For this reason, it is proposed to connect the E-class amplifiers in parallel through a phase-controlled type matching circuit which includes variable capacitors and variable inductors in Π-type connection.

According to the phase-controlled type matching circuit proposed as above, the variable capacitors and variable inductors result in large-sized elements and large-sized amplifier circuit.

In view of the above situation, embodiments of the present disclosure are implemented to provide a power amplifier circuit which can be sized compact by suppressing upsizing of circuit elements.

The embodiments of the present disclosure will be described below with reference to the accompanying drawings. The same or equivalent parts among the following embodiments will be designated with the same reference numerals for simplification of description.

First Embodiment

A first embodiment will be described below. A power amplifier circuit according to the present embodiment is configured to generate an AC (alternating current) output which is supplied to a load, from a DC (direct current) power supply. The power amplifier circuit is usable in applications for wireless power supply of a vehicle, for example, power supply to an unmanned carrier vehicle in a factory and power supply to an electric automotive vehicle. In these applications, the power amplifier circuit is embedded in the ground, for example, and transmits power based on electric field coupling or magnetic field coupling. In the electric field coupling and the magnetic field coupling, parallel-plate capacitors and opposed coils are used as an antenna which is an RF (radio frequency) load, respectively. The power amplifier circuit is operated in an RF frequency band, preferably in a frequency band of ISM (industry science medical) band such as 6.78 MHz or 13.56 MHz. Although dependent on an output of each E-class amplifier and the number of E-class amplifiers as described below, the power amplifier circuit is capable of generating an output voltage in a range from several hundred watts to tens of kilowatts for wireless power supply. The power amplifier circuit according to the present embodiment will be described in more detail with reference to the drawings.

As shown in FIG. 1, a power amplifier circuit 1 is configured by multiple E-class inverters 2 connected in parallel one another. The power amplifier circuit 1 power-amplifies a power supplied from a DC power supply Vh and transmits the amplified power to an RF load $R_L$. The power amplifier circuit 1 is configured by discrete semiconductors, ceramic capacitors, winding inductors and the like, which are mounted on a printed circuit board, for example. Each E-class inverter has the same circuit design. Since no external additional components for combining powers of external power combining circuits are used, efficiency of the power amplifier circuit 1 is not lowered.

Each E-class inverter 2 used in the present embodiment is an E-class amplifier. Since the E-class amplifier is used to convert DC power to AC power, it is referred to as the E-class inverter. Since a multiple number ("n") of E-class inverters 2 are provided, individual E-class inverter 2 is designated with reference numerals as 2-1, 2-2 through 2-$n$. "n" is an integer equal to or larger than 2. In FIG. 1, a circuit configuration of only a first E-class inverter 2-1 is shown in detail, other E-class inverters 2-2 to 2-$n$ are configured the same as the first E-class inverter 2-1.

The E-class inverter 2 includes a resonant type power supply circuit 10, a matching circuit 20 and an internal voltage detection circuit 30.

The resonant type power supply circuit 10 is driven in reference to a radio frequency signal supplied from a signal source 3 provided separately and has a circuit configuration, which includes a phase adjusting circuit 11, a gate driver 12, a MOSFET 13, a diode 14, an LC resonant circuit 15 and a choke coil 16.

The signal source 3 is provided to generate the radio frequency signal to which the resonant type power supply circuit 10 refers and configured by an oscillation circuit, which generates a pulse signal having a rectangular waveform. The signal source 3 outputs a driving signal from which a gate voltage for the MOSFET 13 is generated through the phase adjusting circuit 11 and the gate driver 12. In the present embodiment, the driving signal is, for example, the pulse signal having a frequency of 6.78 MHz and a duty ratio of 50%. The signal source 3 is provided for each E-class inverter 2. The signal source 3 may be provided on a circuit board separate from the circuit board of the other components of the power amplifier circuit 1.

The phase adjusting circuit 11 is configured to adjust a switching phase of the MOSFET 13, which is a switching element, by adjusting a phase of the driving signal based on a detection result of the internal voltage detection circuit 30. Because of the phase adjustment of the driving signal by the phase adjusting circuit 11, the multiple E-class inverters 2 are operated in phase (in the same phase). Although the E-class inverters 2 are designed the same, the signal transmission delay varies among the E-class inverters 2 for various causes. For this reason, the phase adjustment is performed in each E-class inverter 2.

A signal transmission delay variation arises from various causes. For example, in case that the signal source 3 is provided on a circuit board different from that of the other components of the power amplifier circuit 1 and both circuit boards are connected via a coaxial cable, the signal transmission delay variation arises between the circuit boards. The signal transmission delay variation arises also from a signal transmission delay variations in switching of the MOSFET 13 between an on-state and an off-state. Still further, the signal transmission delay variation arises also from manufacturing variations among circuit elements used to configure the resonant type power supply circuit 10. Among various causes of the signal transmission delay variation, the signal transmission delay variation which arises at the time of switching of the MOSFET 13 between the on-state and the off-state is most influential. It was confirmed experimentally that the signal transmission delay is in the range from 5 to 23 ns (nanoseconds). The signal transmission delay variation causes a variation in the phase of the output voltage of the resonant type power supply circuit 10 and lowers the efficiency of the power amplifier circuit 1. For this reason, the phase adjusting circuit 11 is provided to perform phase adjustment so that the variation among the output voltages of the resonant type power supply circuits 10 are reduced and the E-class inverters 2 are operated in phase.

Figure 2:
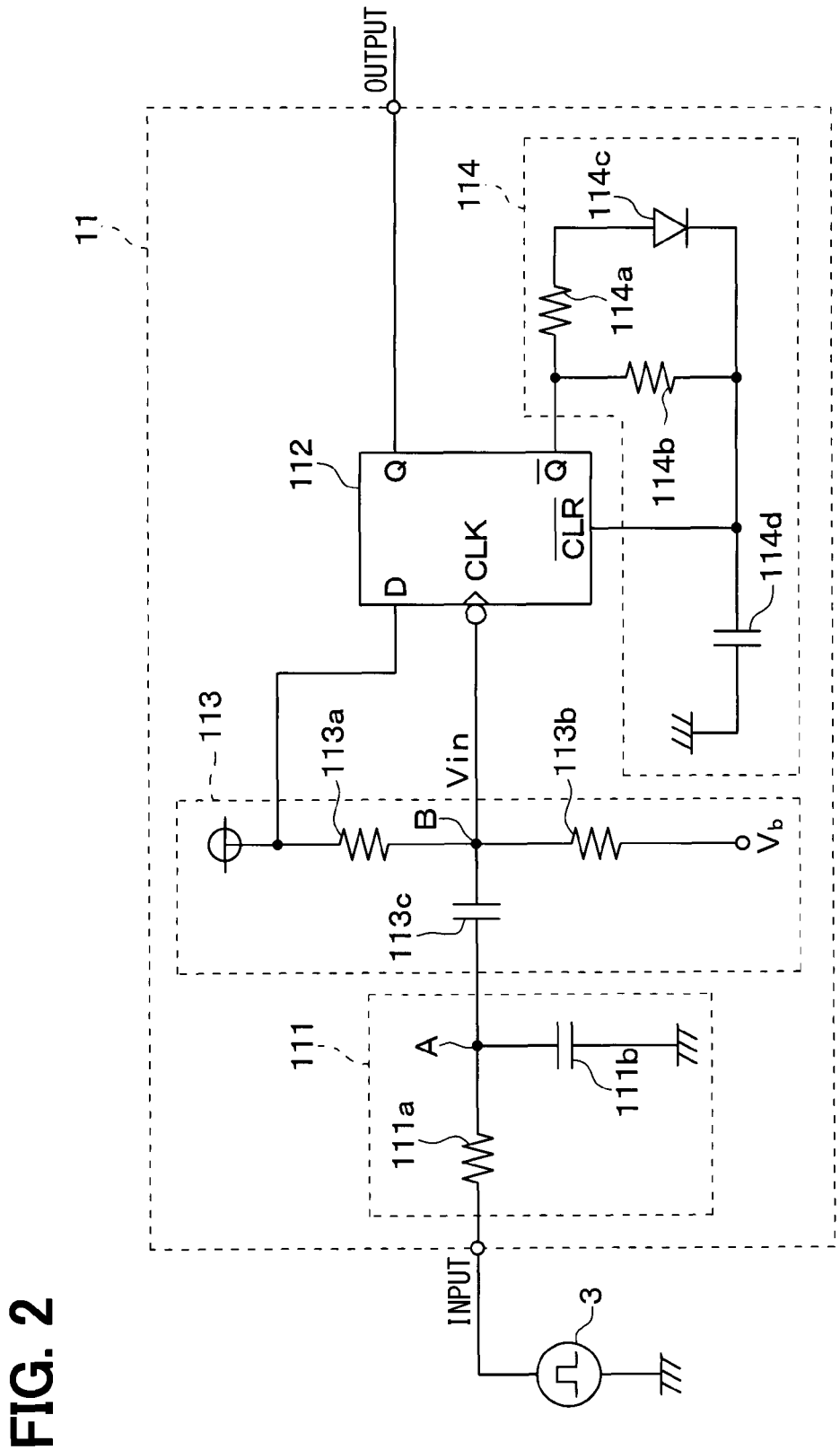
FIG. 2 is a diagram showing a circuit configuration of a phase adjusting circuit.

For example, the phase adjusting circuit 11 is configured as shown in FIG. 2. As shown in FIG. 2, the phase adjusting circuit 11 includes a triangular signal generating circuit 111, a D type flip-flop 112, a voltage dividing circuit 113 and a one-shot pulse generator 114.

The triangular signal generating circuit 111 is configured by a resistor 111a and a capacitor 111b, which are connected in T type. The resistor 111a and a capacitor 113c described later are connected in series between the signal source 3 and the D type flip-flop 112. The capacitor 111b is connected between the resistor 111a and the capacitor 113c in parallel relation to the signal source 3.

With the configuration described above, a voltage of a triangular signal having a triangular waveform is generated at a connection point A when the pulse signal is input from the signal source 3. Further, when a variable voltage Vb is applied as a DC bias voltage to the second voltage dividing resistor 113b, a phase, at which a voltage Vin (referred to as an input voltage hereinafter) at a connection point B passes a voltage threshold value of a clock terminal CLK of the D type flip-flop 112, varies in accordance with an amplitude of the variable voltage Vb. The variable voltage Vb is an output voltage indicating a detection result of the internal voltage detection circuit 30 and varies with the detection result as described later.

The D type flip-flop 112 operates as a circuit which raises an output voltage at a Q terminal for a predetermined period after the input voltage Vin applied to the clock Terminal CLK rises. This predetermined period is defined by a time constant of the one-shot pulse generator 114. As a result, the D type flip-flop 112 outputs from the Q terminal a pulse signal voltage of a fixed duty ratio, specifically 50% duty ratio, always in response to the periodic waveform of the input voltage Vin applied to the terminal CLK once in one cycle. Since the phase of the input voltage Vin of the D type flip-flop 112 is varied in accordance with the variable voltage Vb, the phase of the output voltage of the D type flip-flop 112 is also varied in accordance with the change in the phase of the input voltage Vin.

In the present embodiment, the D type flip-flop 112 is exemplified to react to a positive edge generated when the input voltage Vin is changed from a low level to a high level. However, the D type flip-flop 112 may be a type which reacts in response to a negative edge generated when the input voltage Vin is changed from the high level to the low level. The amount of phase delay in the phase adjusting circuit 11 decreases when the variable voltage Vb increases in case of the positive edge. The amount of phase delay in the phase adjusting circuit 11 increases when the variable voltage Vb increases in case of the negative edge. According to a simulation, the phase adjusting circuit 11 having the circuit configuration shown in FIG. 2 is capable of adjusting the phase in a range from 30° to 210°.

The voltage dividing circuit 113 is a DC biasing circuit and formed of a first voltage dividing resistor 113a, a second voltage dividing resistor 113b and the capacitor 113c. The voltage dividing circuit 113 divides a voltage corresponding to a difference between a constant voltage of a constant voltage source (not shown) applied to the first voltage dividing resistor 113a and the variable voltage Vb by the first voltage dividing resistor 113a and the second voltage dividing resistor 113b. This divided voltage is a voltage corresponding to the variable voltage Vb applied as the DC bias of the connection point B. As the circuit configuration for applying the voltage corresponding to the variable voltage Vb as the DC bias to the connection point B, the voltage dividing circuit 113 may be replaced with other circuit. In case that the voltage dividing circuit 113 is used, it is possible to perform oscillation based on the triangular signal generating circuit 111 even before the variable voltage Vb is applied, that is, even when the variable voltage Vb is zero.

The one-shot pulse generator 114 is configured to generate a one-shot pulse based on a /Q terminal of a D type flip-flop 112 and input the one-shot pulse to a clear terminal CLR of a negative logic. the one-shot pulse generator 114 is formed of resistors 114a, 114b, a diode 114c and a capacitor 114d. The resistor 114b and the capacitor 114d generates the one-shot pulse in response to the negative logic input based on a transient response operation. A time constant of the one-shot pulse generator 114 is set by a resistance value of the resistor 114b and a capacitance value of the capacitor 114d thereby to set a duty ratio of the D type flip-flop 112. Specifically, the one-shot pulse generator 114 operates as follows.

Since an inverted-Q terminal (hereinafter referred to as /Q terminal) of the D type flip-flop 112 is at the high level when the Q terminal of the D type flip-flop 112 is at the low level, the capacitor 114d is charged through the resistor 114a and the diode 114c. Since a D terminal is at the high level when the input voltage Vin to the clock terminal Q rises, the Q terminal changes to the high level and the /Q terminal changes to the low level. With the /Q terminal being at the low level, the capacitor 114d having been charged is discharged through the resistor 114b. When the voltage applied to a clear terminal CLR of the negative logic (herein after referred to as /CLR terminal) decreases exponentially and becomes lower than a voltage threshold value of the CLR terminal, the Q terminal output is cleared and changed to the low level.

With the circuit configuration described above, the phase adjusting circuit 11 generates the input voltage Vin of the pulse waveform, which is phase-adjusted at the connection point B based on the triangular signal of the connection point A generated by the triangular signal generating circuit 111 and the variable voltage Vb applied from the internal voltage detection circuit 30. The phase adjusting circuit 11 thus generates a phase-adjusted driving signal through the D type flip-flop 112.

The gate driver 12 is provided between the phase adjusting circuit 11 and the MOSFET 13. The gate driver 12 amplifies a radio frequency signal, which has been phase-adjusted by the phase adjusting circuit 11, and generates the driving signal for rapidly switching on and off the MOSFET 13 by rapidly charging and discharging an input capacitance of the MOSFET 13.

The MOSFET 13 is a semiconductor switching element and turned on and off in response to the driving signal generated by the gate driver 12 after having been phase-adjusted by the phase adjusting circuit 11. The diode 14 is a built-in diode of the MOSFET 13.

The LC resonant circuit 15 is formed of an inductor 15a and capacitors 15b and 15c. The inductor 15a and the capacitor 15b are connected in series between a DC power supply Vh and the matching circuit 20. The capacitor 15c, which is a shunt capacitor, is connected in parallel between the MOSFET 13 and the inductor 15a. The capacitor 15c includes a parasitic output capacitance of the MOSFET 13. With the configuration described above, the LC resonant circuit 15 performs a series resonance by the inductor 15a and the capacitor 15b when the MOSFET 13 is in the on-state and a series resonance by the capacitor 15c, which is parallel-connected, in addition to the inductor 15a and the capacitor 15b. Thus a sine waveform voltage is generated based on the DC voltage.

The choke coil 16 is provided to suppress a radio frequency noise generated in correspondence to on-off switching of the MOSFET 13.

Since the inductor 15a and the capacitor 15b operate as a strong low-pass filter, the resonant type power supply circuit 10 outputs a current and voltage in a sine waveform. In addition, since the choke coil 16 supplies a DC current having a small current ripple, a current of a superposition of DC and sine waveform AC flows to the MOSFET 13 and the capacitor 15c. When the MOSFET 13 is in the on-state, a pulse-like current which is similar to a half-wave flows between the source and the drain of the MOSFET 13. When the MOSFET 13 is in the off-state, a remaining current flows in and out the capacitor 15c. By appropriate adjustment of element values of the inductor 15a and the capacitors 15b and 15c, the current flowing to the capacitor 15c at the moment of switching of the MOSFET 13 from the off-state to the on-state and the charge stored in the capacitor 15c can be reduced to 0. As a result, it is possible to reduce a switching loss at the turn-on time of the MOSFET 13 and perform power conversion highly efficiently even in case of radio frequency. The output current and the output voltage of the resonant type power supply circuit 10 are referred to as an internal output current and an internal output voltage.

The matching circuit 20 is provided at an output side of the resonant type power supply circuit 10 for impedance matching and formed of a T type matching circuit for suppressing an influence of the E-class inverter 2 of the other phase and making combining of power with the other e-class inverters 2 possible. It is only at time of a specific impedance that the operation condition of the E-class inverter 2 is satisfied. For this reason, it is necessary for the matching circuit 20 to match a load resistance, which is assumed when the RF load $R_L$ is equally divided by the number of the E-class inverters 2, and an optimum load resistance, which is suitable for designing each resonant type power supply circuit 10. For attaining the optimum load resistance, the matching circuit 20 decreases the impedance which is present when viewed from a port of the connection point between the resonant type power supply circuit 10 and the matching circuit 20. For example, even in case that the actual impedance of the RF load $R_L$ is 50Ω, the circuit operates to decrease the impedance of the RF load $R_L$ to 10Ω when viewed from the port of the connection point between the resonant type power supply circuit 10 and the matching circuit 20. The resistance component of the RF load $R_L$ side when viewed from the port is desirably a pure resistance. However, since the resistance component actually includes an L component in many cases, the matching circuit 20 operates to cancel an imaginary number part of the impedance.

Figure 3:
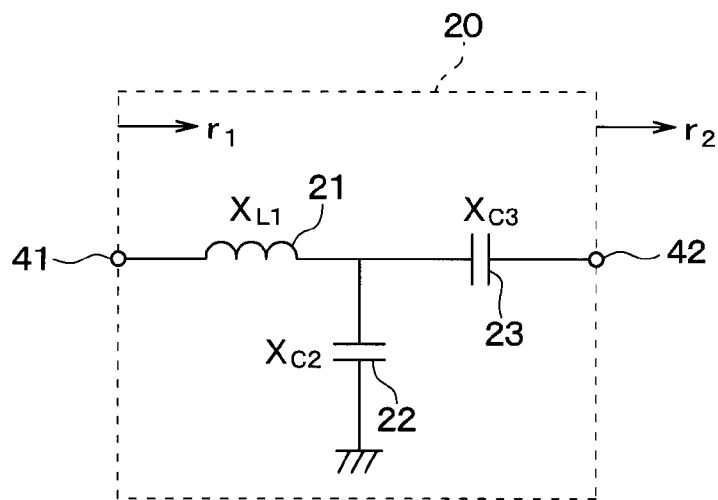
FIG. 3 is a diagram showing a circuit configuration of a matching circuit.

Specifically, as shown in FIG. 3, the matching circuit 20 is formed of an inductor 21 and capacitors 22 and 23. The inductor 21 and the capacitor 23 are connected in series between the resonant type power supply circuit 10 and the RF load $R_L$. The capacitor 22 is connected in parallel between the inductor 21 and the capacitor 23. Although described in detail later, reactance values of the inductor 21 and the capacitors 22 and 23 are set to satisfy the following equations [1] to [3], in which the reactance values of the inductor 21 and the capacitors 22 and 23 are indicated by $X_{L1}$, $X_{C2}$ and $X_{C3}$, respectively.

Assuming in FIG. 3 that an input-side port and an output-side port of the matching circuit 20 are referred to as an input port 41 which is a first port and an output port 42 which is a second port, respectively, $r_1$ indicates an input impedance in case an impedance $r_2$ is connected to the output port 42 and corresponds to an optimum load resistance of the resonant type power supply circuit 10. $r_2$ is an impedance in case the RF load $R_L$ is equally divided by the number of combining of the circuits and a load resistor $nR_L$. "k" is an impedance converting ratio of the matching circuit 20 and expressed as $k=r_2/r_1$. "u" indicates an imaginary part of a ratio "w" between an in-phase admittance and an out-of-phase admittance of an input admittance of the matching circuit 20 in case that the internal output voltage in the parallel connection of the E-class inverters 2 is separated virtually into an in-phase component and an out-of-phase component.

$$X_{L1}=r_1[\sqrt{\{k(1+u^2)\}}+u] \qquad [1]$$

$$X_{C2}=r_1\sqrt{\{k(1+u^2)\}} \qquad [2]$$

$$X_{C3}=r_1[\sqrt{\{k(1+u^2)\}}+ku] \qquad [3]$$

Since the matching circuit 20 is configured to be in the T type and the inductor 21 and the capacitors 22 and 23 are connected to form an LCC (inductor-capacitor-capacitor) circuit, it is possible to minimize the number of inductors and suppress lowering of the entire efficiency which is caused because of the parallel connection of the E-class inverters 2.

The internal voltage detection circuit 30 is configured to adjust the phase of the driving signal used for switching the MOSFET 13 by monitoring the internal voltage of the matching circuit 20, for example, and transmitting an output corresponding to a voltage detection result to the phase adjusting circuit 11. For example, the internal voltage detection circuit 30 has a circuit configuration shown in FIG. 4.

Figure 4:
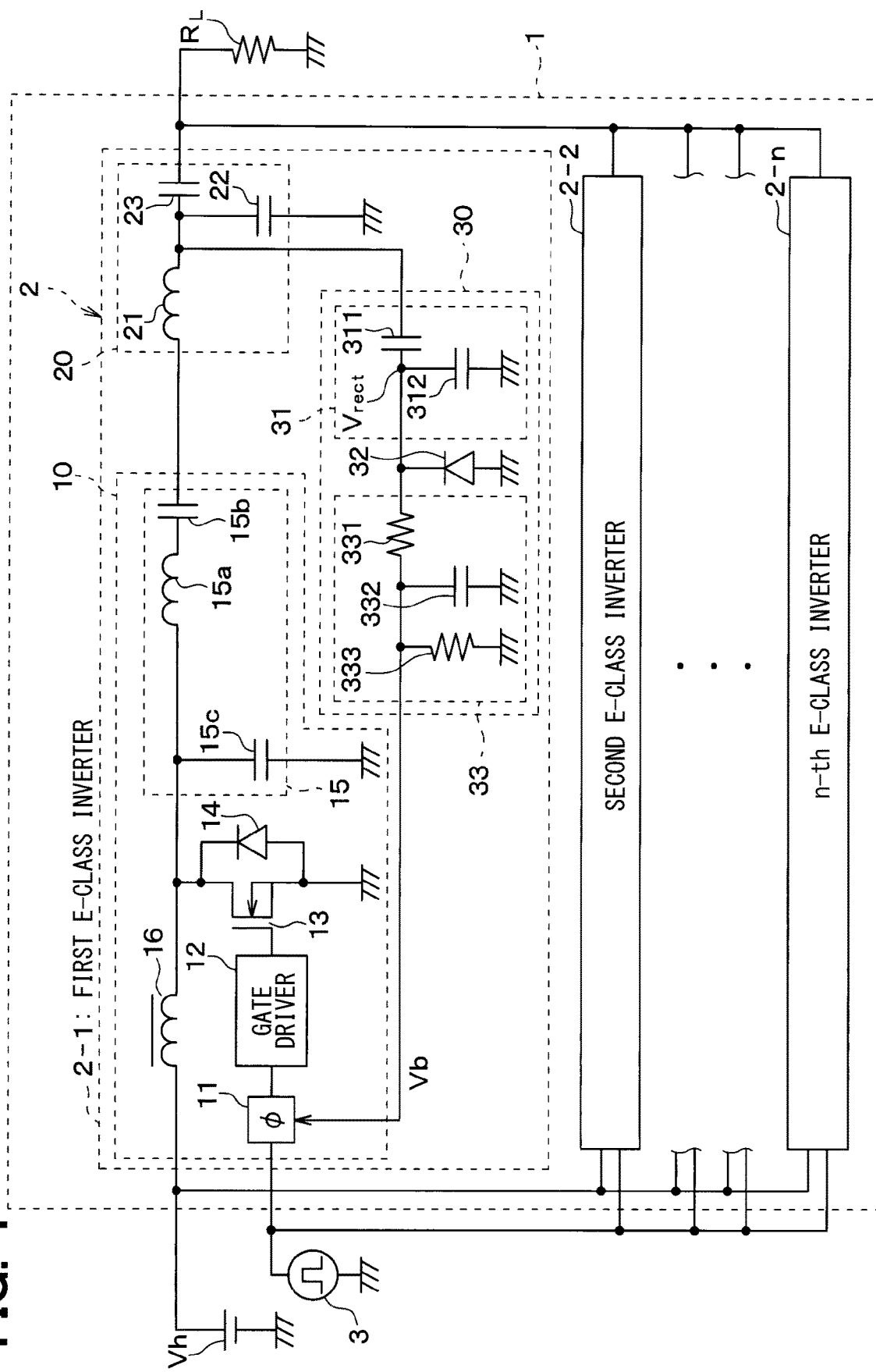
FIG. 4 is a diagram showing a circuit configuration of a power amplifier circuit including details of an internal voltage detection circuit.

The internal voltage detection circuit 30 shown in FIG. 4 is configured to have a voltage dividing circuit 31, a diode 32 and a filtering circuit 33. The voltage dividing circuit 31 is formed of a capacitor 311 and a capacitor 312 to divide a voltage of a sine wave which is to be monitored and shuts off a DC current flow path. The diode 32 generates a voltage Vrect having a DC component by clamping a negative side of a voltage divided by the voltage dividing circuit 31. The filtering circuit 33 is formed of a series resistor 331, a capacitor 332 and a parallel resistor 333 to generate the variable voltage Vb proportional to a DC voltage amplitude which is to be monitored by removing a noise component from the voltage Vrect. By thus using the voltage dividing circuit 31, the diode 32 and the filtering circuit 33, the variable voltage Vb corresponding to the phase of the internal output voltage is generated and fed back to the phase adjusting circuit 11.

As described above, the power amplifier circuit 1 according to the present embodiment is configured. In the power amplifier circuit 1, the MOSFET 13 is driven to turn on and off by the resonant type power supply circuit 10 in each of the multiple E-class inverter 2, and the current voltage of the sine waveform is generated based on the DC voltage supplied from the DC power supply Vh. The current voltage in the sine waveform generated by the resonant type power supply circuit 10 of each E-class inverter 2 is power-combined through the matching circuit 20 and supplied to the RF load $R_L$. Thus the wireless power supply is performed.

In this operation, in each E-class inverter 2, the internal voltage is detected by the internal voltage detection circuit 30 and the phase of the driving signal for the MOSFET 13 is adjusted based on the detected internal voltage. As a result, the phases of the current voltages in the sine waveform of the E-class inverters 2 are matched so that the power combining is performed highly efficiently. Since the power combining can be thus performed highly efficiently without using a variable capacitor and a variable inductor, the circuit elements can be suppressed from being upsized and the power amplifier circuit 1 can be downsized.

Details of circuit design of the matching circuit 20 provided in each E-class inverter 2 of the power amplifier circuit 1 according to the present embodiment will be described next. In the power amplifier circuit 1, the power combining is presumed to be made in the same phase but, as described above, the E-class inverters 2 operate in slightly different phases and not in phase. For this reason, it is necessary to make a circuit design of the matching circuit 20.

First, as described above, the internal output voltage under the parallel connection of the E-class inverters 2 is separated virtually into the in-phase component and the out-of-phase component and the input admittance of the matching circuit 20 for an in-phase component and an out-of-phase component are defined to be an in-phase admittance and an out-of-phase admittance. A ratio between the in-phase admittance and the out-of-phase admittance is provided as a parameter for regulating a behavior of the parallel connection of the E-class inverters 2 relative to a variation of the internal output voltage. As a result of research and study, it was found that the matching circuit 20 needs at least three passive elements. This finding is described below.

Figure 5:
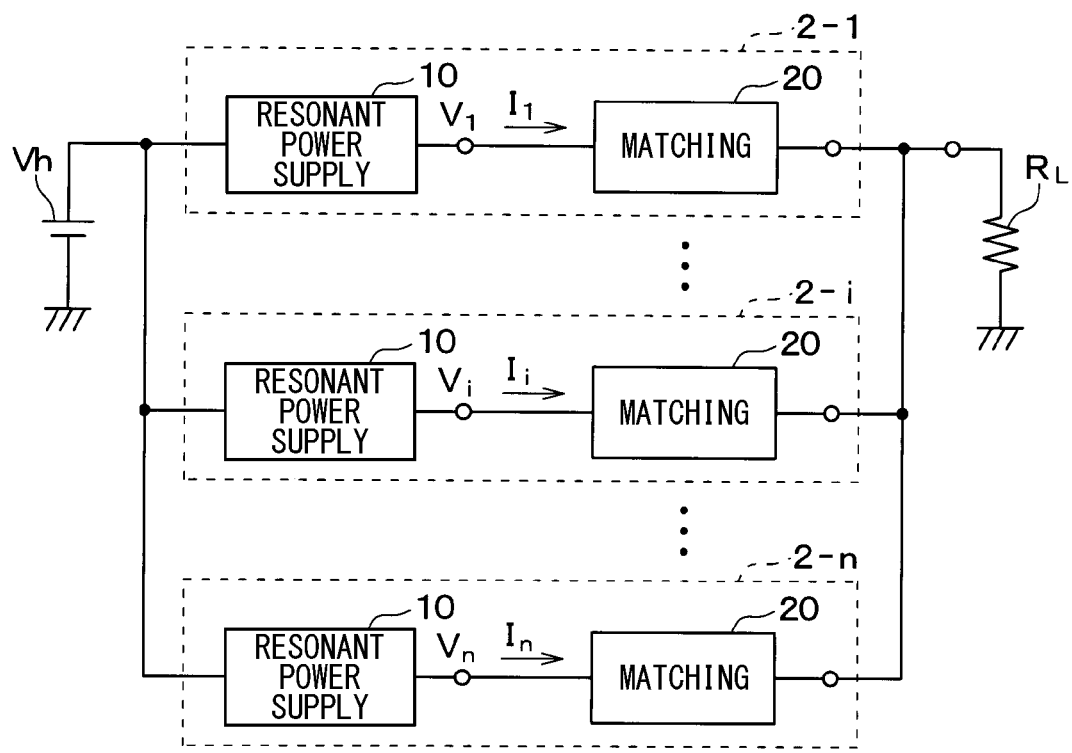
FIG. 5 is a circuit diagram showing a parallel-connected state of an E-class inverter forming a power amplifier circuit.

Focusing on the matching circuit 20 of the parallel connection of the E-class inverters 2, the parallel connection of the E-class inverters 2 includes "n" units of the matching circuits 20. As shown in FIG. 5, an output end of each matching circuit 20 is connected to the RF load $R_L$ in common and an input end of each matching circuit 20 is connected to the resonant type power supply circuit 10 of the same E-class inverter 2.

It is assumed here that a voltage V corresponding to the internal output voltage is applied to the input port 41 of the i-th matching circuit 20 and a current Ii flows in. "i" is an integer which satisfies 1≤i≤n. The voltage of the input port 41 in the matching circuit group is expressed by the following equation [4] in vector notation.

$$Vi = {}^t[V_1, \ldots, V_i, \ldots, V_n] \qquad [4]$$

An average value $V_{iave}$ of a voltage $V_i$ expressed by the equation [4] is defined by the following equation [5] with "i" being from 1 to n.

$$V_{iave} = (1/n)\Sigma V_i \qquad [5]$$

In this case, the voltage Vi is separated virtually into an in-phase voltage $V_{iave}$ and an out-of-phase voltage Vi-Viave as indicated by the following equation [6].

$$V_i = V_{iave} + (V_i - V_{iave}) \qquad [6]$$

Figure 6A:
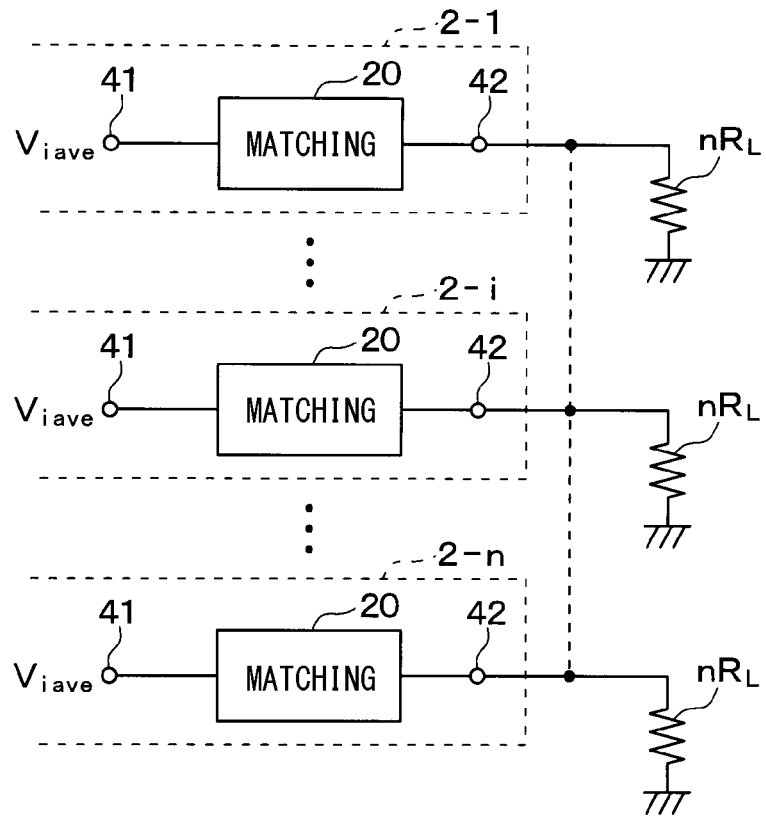
FIG. 6A is an equivalent circuit diagram showing a matching circuit group in case of an application of only an in-phase voltage (same phase voltage) to the E-class inverter.
Figure 6B:
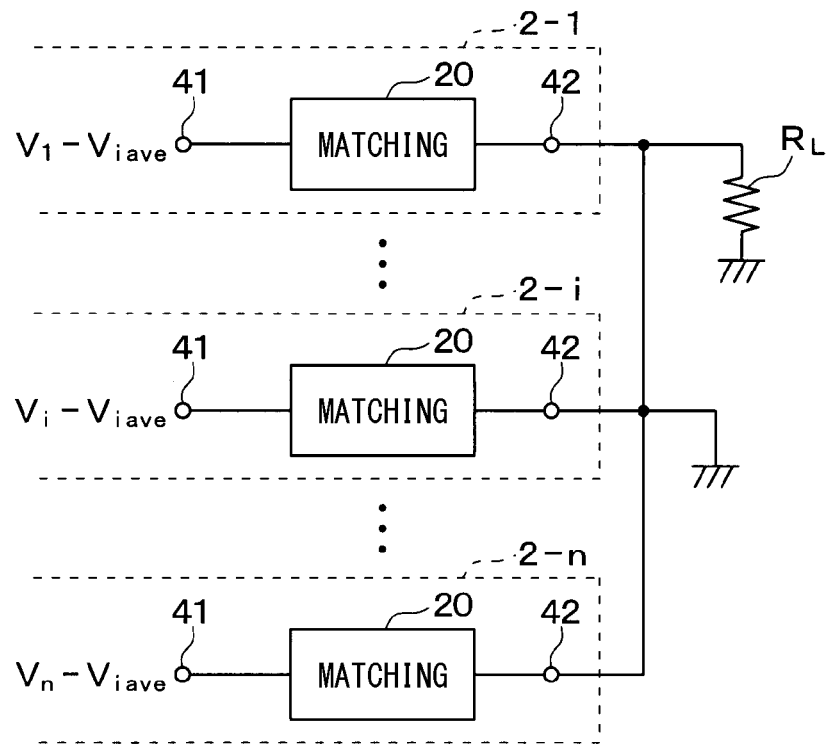
FIG. 6B is an equivalent circuit diagram showing a matching circuit group in case of an application of only an out-of-phase voltage (different phase voltage) to the E-class inverter.

In case that only the in-phase voltage is applied to each E-class inverter 2, it is assumed that the current flows to only the load resistor $nR_L$ which is divided equally by the number of power combining. For this reason, an equivalent circuit of the matching circuit group is expressed as shown in FIG. 6A. In case that only the out-of-phase voltage is applied, a total of the voltage of the input port 41 of each matching circuit 20 which is an element of the voltage vector becomes 0. Since all the matching circuits 20 are in the same circuit configuration, a voltage of the output port 42 is 0. For this reason, an equivalent circuit of the matching circuit group in this case is expressed as shown in FIG. 6B.

Figure 7A:
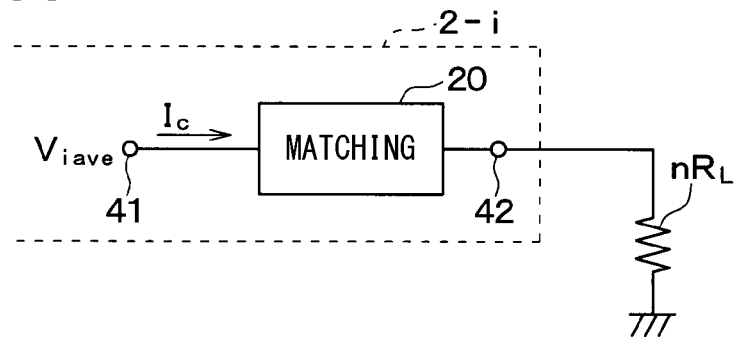
FIG. 7A is an equivalent circuit diagram showing an i-th matching circuit in case that the in-phase voltage is separated.
Figure 7B:
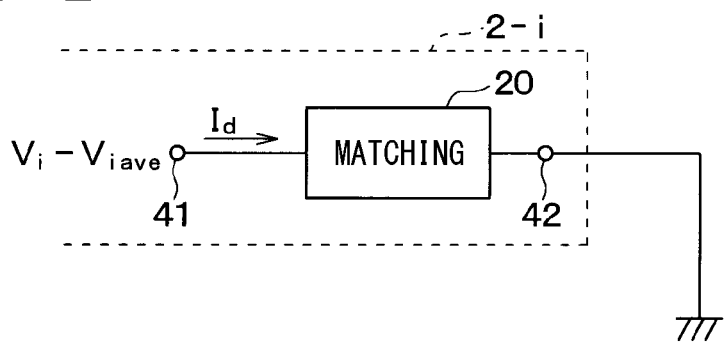
FIG. 7B is an equivalent circuit diagram showing an i-th matching circuit in case that the out-of-phase voltage is separated.

By thus separating the in-phase voltage and the out-of-phase voltage of the voltage $V_i$, the matching circuit group of FIG. 5 are replaced with equivalent circuits divided as shown in FIG. 7A and FIG. 7B.

Here, the input admittances of the input port 41 of the i-th matching circuit 20 relative to the in-phase voltage and the out-of-phase voltage are defined as an in-phase admittance Yc and an out-of-phase admittance Yd, respectively. As understood from FIG. 7A, the in-phase admittance Yc is equal to the input admittance of the input port 41 of the matching circuit 20 at the time of connection of the load resistor nRL to the output port 42. As understood from FIG. 7B, the out-of-phase admittance Yd is equal to the input admittance of the input port 41 of the matching circuit 20 at the time of shorting of the output port 42 and corresponds to a Y parameter Y11 of the matching circuit 20. Similarly, the currents flowing in the input port 41 of the matching circuit 20 in correspondence to the in-phase voltage and the out-of-phase voltage are defined as the in-phase current Ic and the out-of-phase current Id, respectively. The in-phase current Ic and the out-of-phase current Id are expressed by the following equations [7] and [8], respectively. The current Ii is expressed by the following equation [9].

$$I_c = Y_c V_{iave} \qquad [7]$$

$$I_d = Y_d(V_i - V_{iave}) \qquad [8]$$

$$I_i = I_c + I_d = Y_c V_{iave} + Y_d(V_i - V_{iave}) \qquad [9]$$

From the equation [9], the input admittance Yi of the input port 41 of the i-th matching circuit 20 is generalized as the following equation [10].

$$Y_i = Y_C(V_{iave}/V_i) + Y_d(1 - V_{iave}/V_i) \qquad [10]$$

In the parallel connection of the E-class inverters 2, the in-phase currents are combined basically. For this reason, the matching circuits 20 forming the parallel connection of the E-class inverters 2 need be matched between the load resistor $nR_L$, which is assumed when the RF load $R_L$ is equally divided by the number of the E-class inverters 2, and the optimum load $r_{opt}$ of the resonant type power supply circuit 10. The design condition in this case is expressed by the following equation [11].

$$Y_c = r_{opt}^{-1} \qquad [11]$$

Further, the behavior of the matching circuit group, which is caused by unequal operation of the multiple resonant type power supply circuits 10 included in the parallel connection of the E-class inverters 2, relative to the out-of-phase voltage need be regulated. For this reason, as expressed by the equation [12], the out-of-phase admittance Yd is determined to be as large as a fixed ratio w relative to the in-phase admittance Yc. By this ratio w, a ratio between the current Ic and the current Id are determined to some extent.

$$w = v + ju = Y_d/Y_C \qquad [12]$$

In case of a lossless matching circuit, the out-of-phase admittance Yd has only an imaginary number part, and, from the equation [11], the in-phase admittance Yc has only a real number part. For this reason, at the time of circuit design, v is 0 and the ratio between the in-phase admittance Yc and the out-of-phase admittance Yd is determined by the imaginary number part u of the ratio w.

For the matching circuit 20 forming the parallel connection of the E-class inverters 2, two matchings between the load resistance $nR_L$ and the optimum load $r_{opt}$ and a determination of the ratio w are required. That is, a total of three degrees of freedom, that is, design parameters, are required. Assuming that lumped parameter elements having no mutual coupling are used, the matching circuit 20 forming the parallel connection of the E-class inverters 2 is required to include at least three elements. For this reason, the matching circuit 20 is configured to include three elements.

Details of selection of the matching circuit 20 will be described next.

As elements forming the matching circuit 20, an inductor and a capacitor which have no coupling are assumed to be used. The matching circuit 20 forming the parallel-connection E-class inverter 2 is required to satisfy the following conditions (1) to (4).

(1) As described above, at least three elements are included.
(2) Regarding a left side and a right side when viewed from the input port 41, that is, the resonant type power supply circuit 10 side and the RF load $R_L$ side, an impedance conversion between a pure-resistance and a pure-resistance is possible.

(3) It is possible to design an impedance $r_2$ of the output port 42 to be larger than an input impedance $r_1$ of the input port 41.

(4) The number of increase of inductors, which are needed as a result of connection of each resonant-type power supply circuit 10 and the matching circuit 20, is a minimum. The condition (4) is for not lowering the total efficiency of the parallel connection of the E-class inverters 2 in case of an increase in the number of the inductors.

Figure 8A:
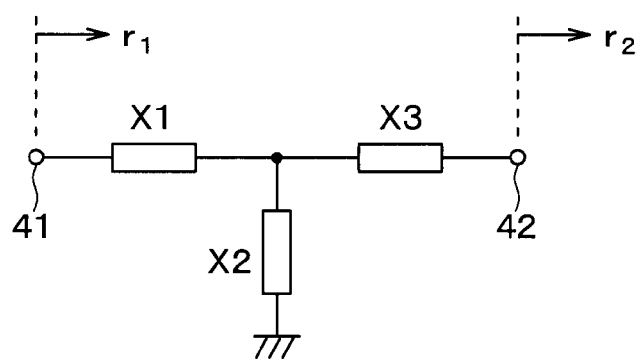
FIG. 8A is a circuit diagram showing a T-type matching circuit.
Figure 8B:
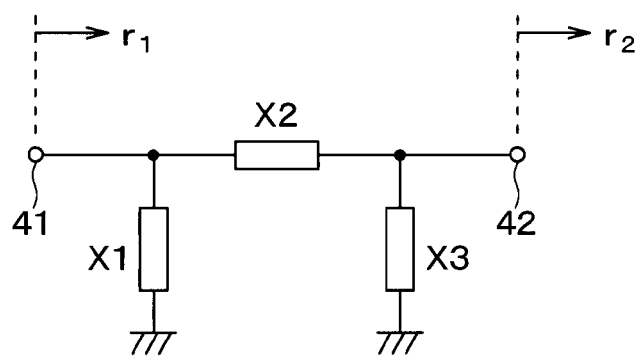
FIG. 8B is a circuit diagram showing a Π-type matching circuit.

In consideration of the conditions (1) and (4), the number of reactance elements to be used is three, and a topology of the matching circuit 20 is limited to a T type shown in FIG. 8A or Π type shown in FIG. 8B. Feature of each combination of the reactance elements used in the T type and the Π type are summarized in a table as shown in FIG. 9A and FIG. 9B, respectively. X1, X2 and X3 in FIG. 9A and FIG. 9B indicate the reactance elements X1, X2 and X3 shown in FIGS. 8A and 8B. Further, the number of increase of inductors (increased inductor) indicates basically the number of inductors included in the matching circuit. As for the inductors used for X1 in the T type topology, it is not counted in the number of increase because of possibility of integration with the inductor 15a included in the resonant type power supply circuit 10.

As shown in these figures, candidates of the matching circuit 20 are limited to eight types in consideration of the conditions (2) and (3). In further consideration of the condition (4), the candidate of the matching circuit 20 is limited to one type, that is, T type LCC circuit. For this reason, the matching circuit 20 is formed of the T type LCC circuit in the present embodiment so that all the conditions (1) to (4) are satisfied.

The reactance value of each reactance element in case of configuration of the matching circuit 20 by the LCC circuit shown in FIG. 3 will be described next.

The reactance value of each reactance element of the matching circuit 20 configured by the T type LCC circuit, in which the imaginary number part of the above-described ratio w is the parameter, is determined as follows. The reactance of the inductor 21 and the capacitors 22 and 23 of the matching circuit 20 configured by the T type LCC circuit shown in FIG. 2 are assumed to be $X_{L1}$, $X_{C2}$ and $X_{C3}$, respectively. The impedance in case that the impedance $r_2$ is connected to the output port 42 is assumed to be $r_1$, and the impedance in case that the RF load $R_L$ is equally divided by the number of power combining. In this case, an impedance conversion ratio k of the matching circuit 20 is expressed by the following equation [13].

$$k=r_2/r_1 \quad [13]$$

First, the reactance values are determined by applying a ratio between the reactance $X_{C2}$ and the reactance $X_{C3}$. The ratio r is expressed by the following equation [14].

$$r=X_{C3}/X_{C2} \quad [14]$$

The impedance $r_1$ when the RF load $R_L$ side is viewed from the input port 41 at the time of connection of the impedance $r_2$ to the output port 42 becomes equal to $r_1$. As a result, the reactance $X_{L1}$, $X_{C2}$ and $X_{C2}$ are formularized as defined by the following equations [15], [16] and [17], respectively.

$$X_{L1}=r_1\{k-(1+r)\}/\sqrt{\{k-(1+r)^2\}} \quad [15]$$

$$X_{C2}=-r_1k/\sqrt{\{k-(1+r)^2\}} \quad [16]$$

$$X_{C3}=rX_{C2} \quad [17]$$

Further, the impedance when the RF load $R_L$ side is viewed from the input port 41 in case of shorting of the output port 42 becomes $jr_1/u$ because of the above equations [11] and [12]. As a result, the values k, r and u have a relation as defined by the following equation [18]. Since the matching circuit 20 formed of the T type LCC circuit is inductive in case that the output port 42 is shorted, the value u becomes a negative real number. A range of variation of the value u is defined by the following equation [19].

$$K=(1+r)^2(1+u^{-2}) \quad [18]$$

$$u \leq -1/\sqrt{(k-1)} \quad [19]$$

By combining the equations [15] to [17] with the equation [18], a design equation for the reactance value of each reactance element of the matching circuit 20, which is formed of the T type LCC circuit having the parameter u of the above equations [1] to [3], is determined.

By thus configuring the matching circuit 20 by the T type LCC circuit and designing the reactance value of each reactance element to the value defined by the equations [1] to [3], the conditions (1) to (4) described above are satisfied. As a result, it is possible to combine power highly efficiently even in case that the E-class inverters 2 are connected in parallel.

As described above, the power amplifier circuit 1 according to the present embodiment is provided with multiple E-class inverters 2, each of which has the same circuit configuration of the resonant type power supply circuit 10 and the matching circuit 20, and the power supply circuits 10 are connected in parallel through the matching circuits 20. The internal voltage detection circuit 30 is configured to monitor the internal voltage of the matching circuit 20 and the phase adjusting circuit 11 is configured to adjust the phase based on the variable voltage Vb corresponding to the internal output voltage. Thus the phase of the current voltage in the sine waveform of each E-class inverter 2 is matched to perform combining of power with high efficiency. Since the power combining can be performed with high efficiency without using a variable capacitor and a variable inductor, it is possible to suppress upsizing of elements and perform downsizing of the power amplifier circuit 1.

Although the phase adjusting circuit 11 is configured to perform the phase adjustment based on the voltage applied to the capacitor 22 in the matching circuit 20 (referred to as matching circuit internal voltage), it is confirmed that the amplitude and the phase of the matching circuit internal voltage has a strong relationship.

For example, assuming that an output voltage phase at the connection point of parallel connection of the E-class inverters 2 relative to the phase of the signal supply source 3 is $\theta_{si}$ and its average value is $\theta_{siave}$, an output relative phase which is a deviation of the output voltage phase $\theta_{si}$ of each E-class inverter 2 from the average value $\theta_{siave}$ is defined as $\theta_{ri}$. Specifically, the average value $\theta_{siave}$ of the output voltage phase $\theta_{si}$ and the output relative phase $\theta_{ri}$ are defined by the following equations [20] and [21], respectively, with "i" being from 1 to n.

$$\theta_{siave}=(1/n)\Sigma\theta_{si} \quad [20]$$

$$\theta_{ri}=\theta_{si}-\theta_{siave} \quad [21]$$

The output relative phase $\theta_{ri}$ defined as described above is a physical quantity which integrates variations in the output voltage phase $\theta_{si}$ caused by various factors.

As a preparation for simulating an application of variation to the output relative phase $\theta_{ri}$, various characteristics are acquired by simulating the multiple E-class inverters 2 to operate completely in phase. Specifically, by varying the parameters of the matching circuit 20 and the number of the E-class inverters 2, which are to be combined, variations are investigated with respect to peak values of a drain voltage and a drain current of the E-class inverter 2, a time average value of power determined by multiplication of the drain voltage and the drain current, efficiency and the amplitude of the matching circuit internal voltage. As a result, it was found that characteristic values other than that of the amplitude of the matching circuit internal voltage did not change substantially even if the parameters of the matching circuit 20 and the number of the combined E-class inverters 2 are varied. This is because the load to the resonant type power supply circuit 10 did not change whether the parameters of the circuit and the number of the combined E-class inverters 2 were changed.

Further, many trials were conducted to reproduce the variation in the output relative phase $\theta_{ri}$ by applying a random phase, which follows the normal distribution, to each E-class inverter 2. Then, the amplitude of the matching circuit internal voltage is extracted and normalization was made by using the results produced at the time of the in-phase operation.

Based on this result, the relations between the output relative phase $\theta_{ri}$ of the E-class inverter 2 and the normalized amplitude of the matching circuit internal voltage were plotted. As a result, even in case that the number of the E-class inverters 2 connected in parallel were three or more, a linear distribution was exhibited without spreading two-dimensionally. Moreover, an inclination of the linear distribution was generally constant as far as the parameter u of the matching circuit 20 was constant, even in case that the number of the E-class inverters 2 connected in parallel was varied.

From this result, it is confirmed that there is a strong correlation between the output relative phase $\theta_{ri}$ of the E-class inverter 2 and the normalized amplitude of the matching circuit internal voltage. It is further confirmed that the relation between the output relative phase $\theta_{ri}$ of a certain E-class inverter 2 and the normalized amplitude of the matching circuit internal voltage is generally not affected even in case that the multiple E-class inverters 2 interfere mutually.

Since the amplitude of the matching circuit internal voltage is the parameter which indicates the output relative phase $\theta_{ri}$, it is possible to adjust the phase by the phase adjusting circuit 11 based on the variable voltage Vb corresponding to the amplitude of the matching circuit internal voltage by monitoring the matching circuit internal voltage. It is thus possible to realize the phase adjustment regardless of the number of the E-class inverters 2 as far as the matching circuit 20 is designed by using the parameter u.

In addition, the normalization was also made in the simulation described above by using a result exhibited at the time of in-phase operation, with respect to a peak value of a drain voltage, a peak value of a drain current and a time average value of a drain loss, which is determined by multiplication of the drain voltage and the drain current. These normalizations indicate how much the variation in the output relative phase $\theta_{ri}$ adversely affects a switching element used in the parallel connection of the E-class inverters 2, specifically MOSFET 13 in the present embodiment.

Assuming that the E-class inverter 2 is designed based on a standard of derating of a general power semiconductor, a switching element is likely to be broken when a normalized drain peak voltage, a normalized drain peak current and a normalized drain loss exceed 1.25, 1.43 and 2.0, respectively. In the simulation result, however, both the normalized drain peak voltage and the normalized drain peak current did not exceed 1.25 and 1.43, respectively, but the normalized drain loss exceeded 2.0. It is therefore assumed that the switching element will break because of an increase in the drain loss caused by the variation in the output relative phase $\theta_{ri}$. For this reason, it is understood that reduction of the variation in the output relative phase $\theta_{ri}$ will be effective from the standpoint of suppressing the breakage of the switching element.

It is thus possible to perform the phase adjustment by the phase adjusting circuit 11 based on the matching circuit internal voltage. It is further possible to improve the efficiency of the power amplifier circuit 1 formed of the parallel connection of the multiple E-class inverters 2 and suppress breakage of the switching element by the phase adjustment.

It is noted that, as described above, the variation in the output relative phase $\theta_{ri}$ is caused by the variation in the transmission delay in switching between the on-state and the off state of the switching element and the transmission delay in the gate driver 12. To counter these variations, it is proposed to measure in advance the phase delay characteristics of the switching elements and ICs (integrated circuits) for use as the gate drivers 12, which are quantity-purchased, and use such a combination of the switching element and the IC having the similar phase delay characteristics such as similar phase delay amounts for the parallel connection of the E-class inverters 2.

However, this proposal requires instruments and manpower to measure the phase delay characteristics, and needs verification about how much extent the actual operation state is reproduced at the time of measurement. Further, in case that the number of the E-class inverters 2 connected in parallel are many but the number of manufactured samples are not many, the switching elements and the ICs need be provided in far more number than those actually used for finding a combination which provides similar phase delay characteristics.

For the reasons described above, it is particularly effective to perform the phase adjustment of the driving signal by the phase adjusting circuit 11 as performed in the present embodiment in case that the power amplifier circuit 11 including the parallel-connected E-class inverters 2 is manufactured in a wide variety and small lot or in case that the power amplifier circuit 11 includes a large number of parallel-connected E-class inverters 2.

Second Embodiment

A second embodiment will be described next. The present embodiment is different from the first embodiment in the configuration of the phase adjusting circuit 11 and the other configuration is the same. Therefore, only the difference will be described below.

Figure 10:
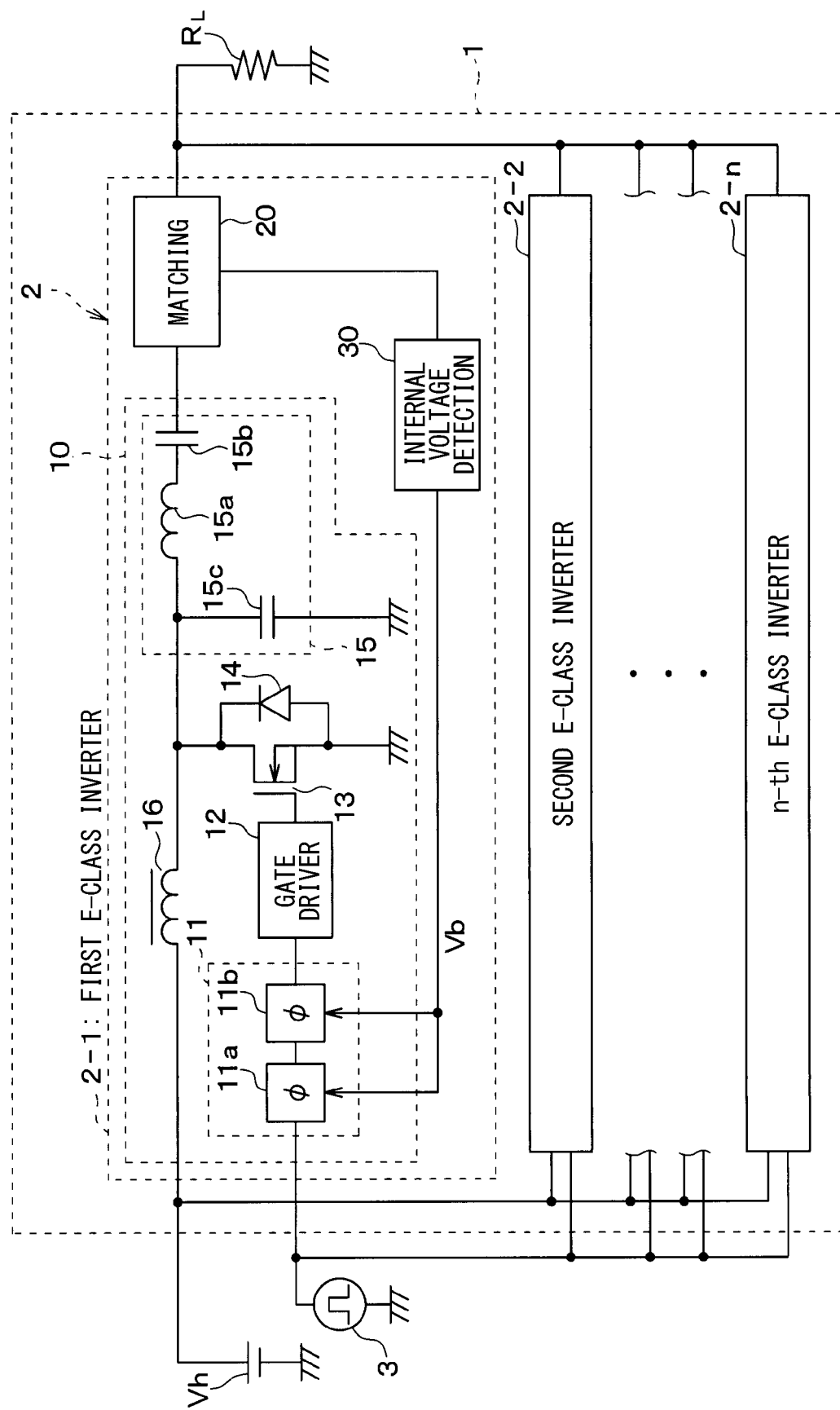
FIG. 10 is a diagram showing a circuit configuration of a power amplifier circuit according to a second embodiment.

As shown in FIG. 10, in the present embodiment, the phase adjusting circuit 11 is formed of a first phase adjusting circuit 11a and a second phase adjusting circuit 11b. Each of the first phase adjusting circuit 11a and the second phase adjusting circuit 11b is formed to have the same circuit configuration as shown in FIG. 2. That is, the phase adjusting circuit 11 of the present embodiment is formed of two stages of the phase adjusting circuits 11, each of which has the same configuration as described in the first embodiment.

As described above, the phase adjustment is made possible in the range between 30° and 210° in the circuit configuration shown in FIG. 2. For this reason, by connecting the first phase adjusting circuit 11a and the second phase adjusting circuit 11b in series, it is possible to perform the phase adjustment over a range twice as wide as that of the first embodiment. It is thus possible to perform the phase adjustment over a wider range in the power amplifier circuit 1.

OTHER EMBODIMENT

Although the present disclosure has been made based on the embodiments described above, the present disclosure is not limited to such embodiments but includes various changes and modifications which are within equivalent ranges. In addition, other combinations and configurations including further only a single element, more or less elements, are also within the spirit and scope of the present disclosure.

Further, each structural element of the embodiments described above is not necessarily essential unless it is specifically described as being essential or understood as being essential in principle. A quantity, a value, an amount, a range or the like referred to in the description of the embodiments described above is not necessarily limited to such a specific value, amount, range or the like, unless it is specifically described as essential or understood as being essential in principle. In addition, each circuit configuration is only exemplary and other circuit configuration may be applied to perform the similar function.

Figure 11:
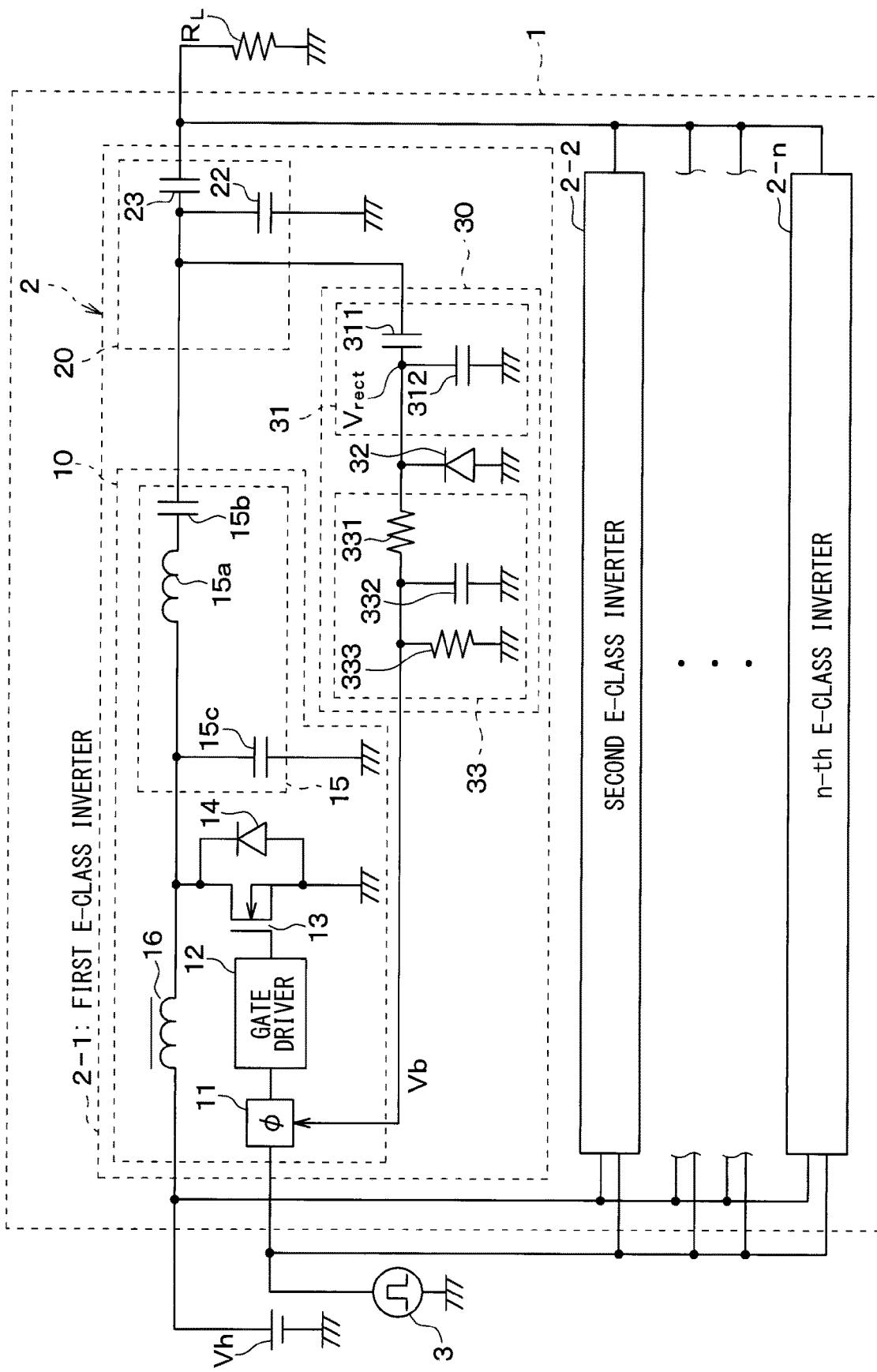
FIG. 11 is a diagram showing a circuit configuration of a power amplifier circuit according to the other embodiment.

For example, in the above embodiments, the matching circuit 20 is formed of the LCC circuit, in which the inductor 21 and the capacitors 22 and 23 are each provided as a separate element. However, this is just one example. For example, as shown in FIG. 11, the inductor 21 may be integrated with the inductor 15a in the LC resonant circuit 15. In this case, although the number of inductor element is one, a reactance value is set to a sum of the reactance of the inductor 15a of the LC resonant circuit 15 and the inductor 21 of the matching circuit 20.

Although the internal voltage of the matching circuit 20 applied to the capacitor 22 is detected as one example of the internal voltages of the resonant type power supply circuit 10 or the matching circuit 20 which the internal voltage detection circuit 30 monitors, it is not limited so. For example, the internal output voltage corresponding to the output voltage of the resonant type power supply circuit 10 may be monitored by the internal voltage detection circuit 30 or the voltage at a midpoint of the resonant type power supply circuit 10 may be monitored. That is, the voltage on the RF load $R_L$ side relative to the connection point between the inductor 15a and the capacitor 15b of the LC resonant circuit 15 and the DC power supply Vh side relative to the output of the matching circuit 20, that is, the voltage on the DC power supply Vh side relative to the connection point between the capacitors 22 and 23 may be monitored by the internal voltage detection circuit 30. However, since a high voltage is generated on the DC power supply Vh side relative to the inductor 15a, it is preferable to monitor the voltage on the RF load $R_L$ side relative to the inductor 15a.

Further, in the above embodiments, the inverter that generates the AC output current and output voltage based on the DC power supply Vh has been described as an example of the E-class type inverter 2. However, as the inverter, other types of inverters such as a D-class type may be used. Further, although the MOSFET 13 is exemplarily used as the switching element that generates the AC output current and the AC output voltage based on the DC power supply Vh, other types of switching elements may be used. In this case as well, the similar effect as that of the above embodiments can be provided by adjusting the switching phase of the switching element by the phase adjusting circuit 11.

What is claimed is:

1. A power amplifier circuit for generating an AC output supplied to a load from a DC power, the power amplifier circuit comprising:
    multiple inverters, each inverter including a resonant type power supply circuit, which has a switching element and generates the AC output from the DC power, and a matching circuit provided at an output side of the resonant type power supply circuit,
    wherein:
    the multiple inverters are connected in parallel such that the resonant type power supply circuit of the each inverter is connected in parallel with each other through the matching circuit of the each inverter;
    the each inverter includes an internal voltage detection circuit for detecting an internal voltage of the resonant type power supply circuit or the matching circuit at a DC power supply side than an output of the matching circuit, and a phase adjusting circuit for adjusting a switching phase of the switching element based on a detection result of the internal voltage; and
    the phase adjusting circuit includes a triangular signal generating circuit for generating a triangular signal based on a signal from a signal source, a DC bias circuit for generating an input voltage which is phase-adjusted by an application of a DC bias to an output of the triangular signal generating circuit, and a D type flip-flop for generating a driving signal which is phase-adjusted in response to the input voltage as a clock.

2. The power amplifier circuit according to claim 1, wherein:
    the resonant type power supply circuit is an E-class type.

3. The power amplifier circuit according to claim 1, wherein:
    the matching circuit is formed of a T-type LCC circuit, which includes an inductor, a first capacitor and a second capacitor.

4. The power amplifier circuit according to claim 3, wherein:
    the resonant type power supply circuit has an LC resonant circuit, which includes an inductor and capacitors; and
    the inductor of the T-type LCC circuit is integrated with the inductor included in the LC resonant circuit.

5. The power amplifier circuit according to claim 3, wherein:
    the inductor and the second capacitor, which are included in the LCC resonant circuit, are connected in series between the DC power supply and the load, and the first capacitor included in the LCC resonant circuit is connected in parallel to the DC power supply between the inductor and the second capacitor; and
    a reactance value $X_{L1}$ of the inductor, a reactance value $X_{C2}$ of the first capacitor and a reactance value $X_{C3}$ of the second capacitor satisfies the following equations [1], [2] and [3], in which $r_2$ indicates an impedance determined by equally dividing the load by the number of the multiple inverters, $r_1$ indicates an input impedance at time when the impedance $r_2$ is connected relative to an output port of the matching circuit, k indicates an impedance conversion ratio of the matching circuit, and u indicates an imaginary part of a ratio between an in-phase admittance and an out-of-phase admittance forming an input admittance of the matching circuit, $$X_{L1}=r_1[\sqrt{\{k(1+u^2)\}}+u] \quad [1]$$

$$X_{C2}=r_1\sqrt{\{k(1+u^2)\}} \quad [2] \text{ and}$$

$$X_{C3}=r_1[\sqrt{\{k(1+u^2)\}}+ku] \quad [3].$$

6. A power amplifier circuit for generating an AC output supplied to a load from a DC power, the power amplifier circuit comprising:

multiple inverters, each inverter including a resonant type power supply circuit, which has a switching element and generates the AC output from the DC power, and a matching circuit provided at an output side of the resonant type power supply circuit, wherein:

the multiple inverters are connected in parallel such that the resonant type power supply circuit of the each inverter is connected in parallel with each other through the matching circuit of the each inverter;

the each inverter includes an internal voltage detection circuit for detecting an internal voltage of the resonant type power supply circuit or the matching circuit at a DC power supply side than an output of the matching circuit, and a phase adjusting circuit for adjusting a switching phase of the switching element based on a detection result of the internal voltage;

the matching circuit is formed of a T-type LCC circuit, which includes an inductor, a first capacitor and a second capacitor, the inductor and the second capacitor, which are included in the LCC resonant circuit, are connected in series between the DC power supply and the load, and the first capacitor included in the LCC resonant circuit is connected in parallel to the DC power supply between the inductor and the second capacitor; and a reactance value $X_{L1}$ of the inductor, a reactance value $X_{C2}$ of the first capacitor and a reactance value $X_{C3}$ of the second capacitor satisfies the following equations [1], [2] and [3], in which $r_2$ indicates an impedance determined by equally dividing the load by the number of the multiple inverters, $r_1$ indicates an input impedance at time when the impedance $r_2$ is connected relative to an output port of the matching circuit, k indicates an impedance conversion ratio of the matching circuit, and u indicates an imaginary part of a ratio between an in-phase admittance and an out-of-phase admittance forming an input admittance of the matching circuit, $$X_{L1}=r_1[\sqrt{\{k(1+u^2)\}}+u] \quad [1]$$

$$X_{C2}=r_1\sqrt{\{k(1+u^2)\}} \quad [2] \text{ and}$$

$$X_{C3}=r_1[\sqrt{\{k(1+u^2)\}}+ku] \quad [3].$$

\* \* \* \* \*